United States Patent
Higuchi

[11] Patent Number: 5,881,364
[45] Date of Patent: Mar. 9, 1999

[54] RADIO PAGER HAVING CORRECTING CIRCUIT RESPONSIVE TO TEMPERATURE VARIATION

[75] Inventor: Norihiko Higuchi, Shizuoka, Japan

[73] Assignee: NEC Corporation, Tokyo, Japan

[21] Appl. No.: 629,887

[22] Filed: Apr. 11, 1996

[30] Foreign Application Priority Data

Apr. 11, 1995 [JP] Japan ................................ 7-085136

[51] Int. Cl.⁶ .......................... H04B 7/00; H04Q 3/02
[52] U.S. Cl. .................. 455/38.2; 455/38.1; 455/309; 455/312
[58] Field of Search ......................... 455/38.1, 38.2, 455/38.5, 296, 298, 309, 312

[56] References Cited

U.S. PATENT DOCUMENTS

| | | | |
|---|---|---|---|
| 4,628,272 | 12/1986 | Davis et al. | 329/110 |
| 5,208,833 | 5/1993 | Erhart et al. | 375/20 |
| 5,220,655 | 6/1993 | Feldt | 307/310 |
| 5,311,554 | 5/1994 | Morera et al. | 375/75 |
| 5,564,091 | 10/1996 | Goldfinger | 455/309 |
| 5,610,950 | 3/1997 | Duch | 455/296 |
| 5,659,884 | 8/1997 | Daughtry, Jr. et al. | 455/298 |

FOREIGN PATENT DOCUMENTS 2507378  8/1975  Germany.

*Primary Examiner*—Tommy P. Chin
*Assistant Examiner*—Anand S. Rao
*Attorney, Agent, or Firm*—Sughrue, Mion, Zinn, Macpeak & Seas, PLLC

[57] ABSTRACT

In a radio pager capable of receiving a paging signal subjected to multilevel digital frequency modulation, an analog-to-digital converter (ADC) receives a demodulated voltage signal in the form of an analog signal from a demodulator. The ADC functions to define the upper limit of an analog signal conversion range with a first reference voltage and to define the lower limit of the same with a second reference voltage. Even when at least one of the demodulation sensitivity and demodulated center voltage of the demodulated voltage signal changes with a change in temperature and causes the signal to change, the relation between the signal range of the demodulated voltage signal and the analog signal conversion range of the ADC is maintained constant. Therefore, even if the demodulated voltage signal before temperature compensation changes, the ADC is capable of outputting a stable digital signal identical in content or data with an intermediate frequency signal input to the demodulator.

1 Claim, 16 Drawing Sheets

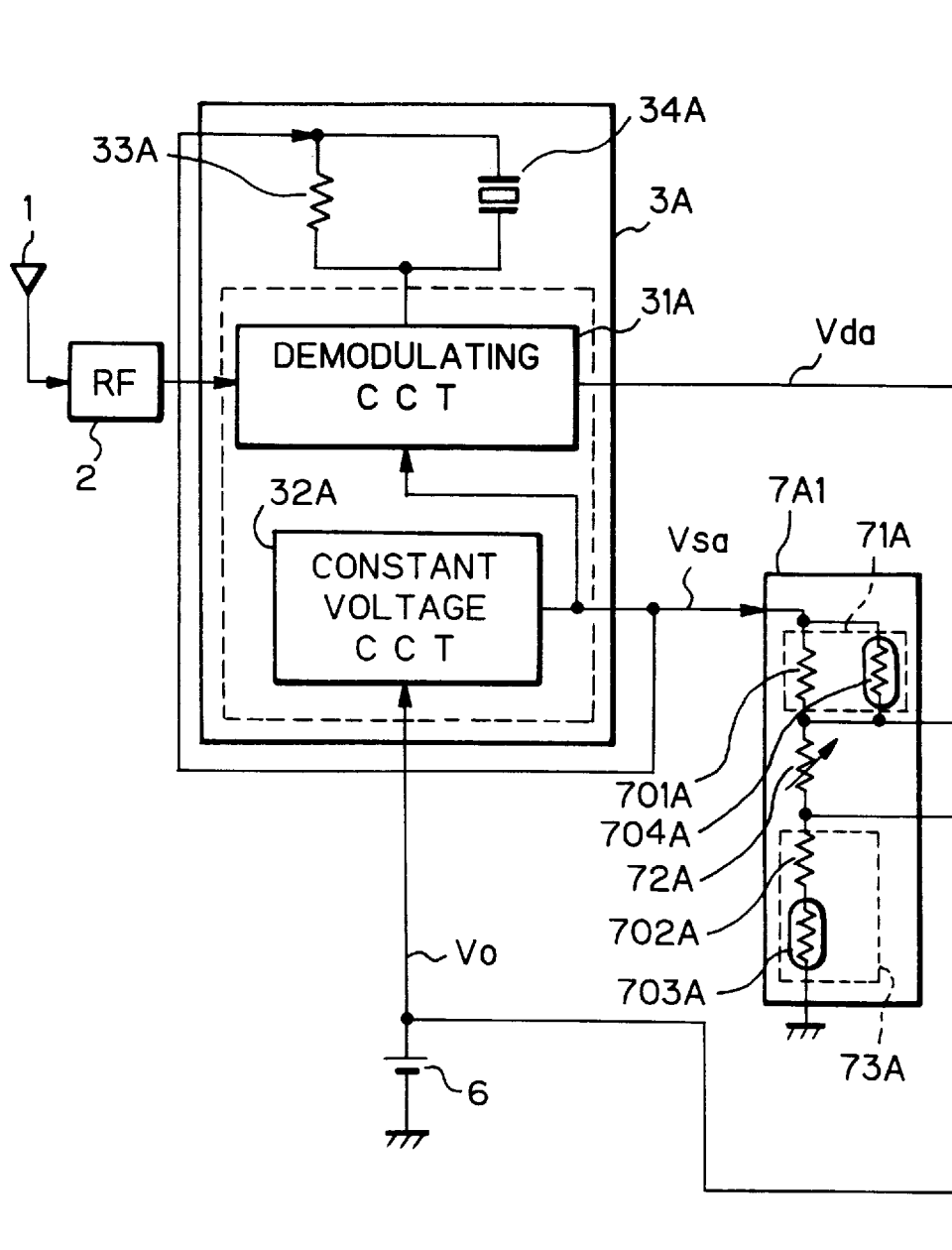

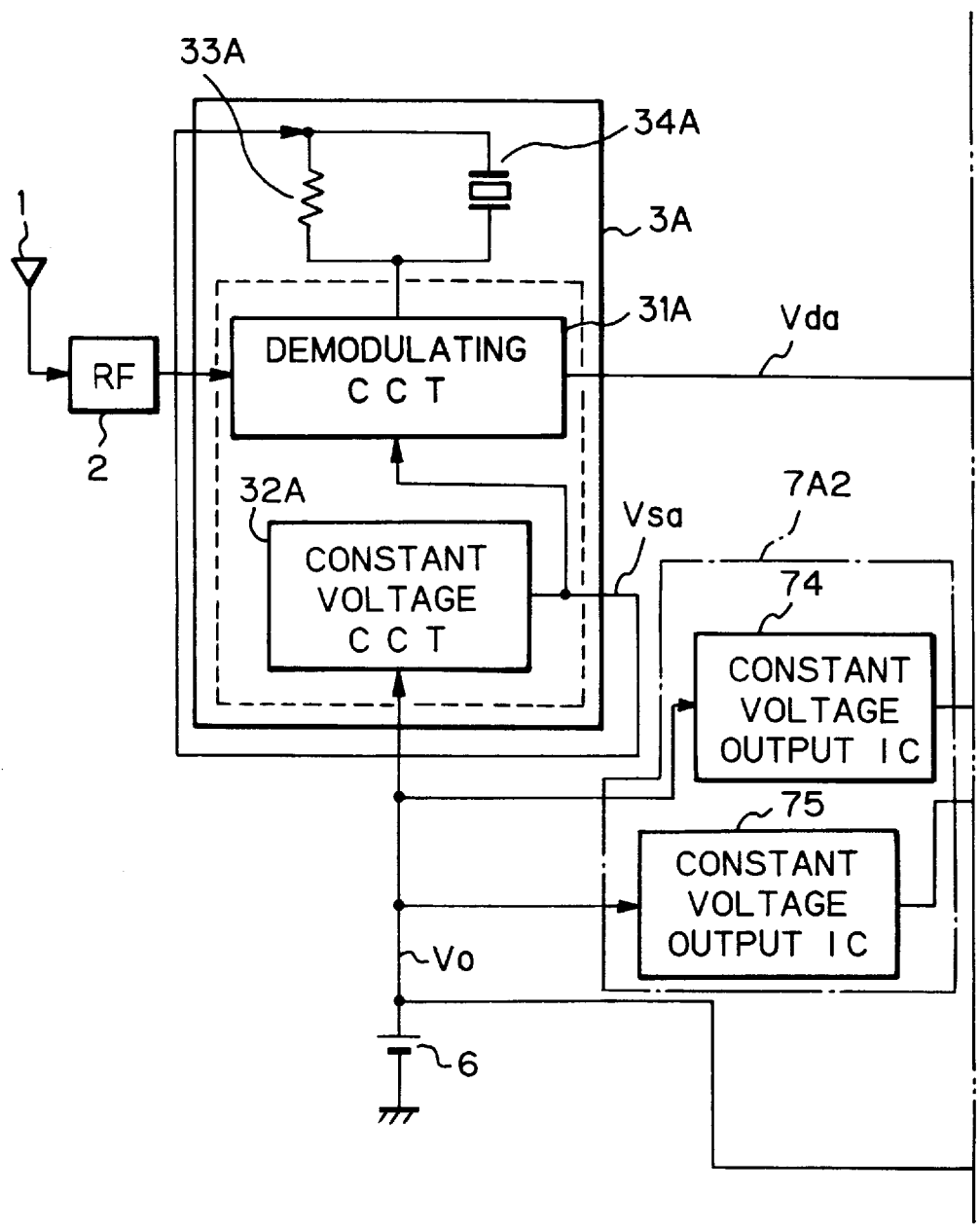

RADIO PAGER HAVING CORRECTING CIRCUIT RESPONSIVE TO TEMPERATURE VARIATION

BACKGROUND OF THE INVENTION

The present invention relates to a radio pager and, more particularly, to a radio pager capable of receiving a paging signal subjected to multilevel digital frequency modulation.

In a radio pager of the type described, a paging signal coming in through an antenna is applied to a radio or radio frequency (RF) section. The RF section amplifies the paging signal and converts its frequency to thereby output an intermediate frequency (IF) signal. The IF signal is applied to a demodulator. The demodulated voltage, or analog signal, is applied to an analog-to-digital converter (ADC). The ADC converts the input voltage to a digital on the basis of first and second reference voltages which respectively define the upper limit and lower limit of the conversion range assigned to the analog signal or demodulated voltage. The digital signal output from the ADC is delivered to a controller including a decoder. The decoder decodes the input digital signal and outputs the resulting address number, message and so forth. The controller compares the decoded address number and an address number assigned to the pager and stored in an address memory beforehand. If the two address numbers compare equal, the controller alerts the user of the pager to the incoming call.

It is optimal that the reference voltages delimiting the signal conversion range of the ADC be matched to the maximum variation range of the demodulated voltage. However, when the demodulation characteristic of the demodulator noticeably depends on temperature, it is necessary to broaden the signal conversion range of the ADC. A broader ADC conversion range directly translates into a lower ADC resolution and therefore into a greater ADC error. As a result, the output digital signal is more susceptible to noise and other undesirable factors. Further, the relation between the signal conversion range of the ADC and the demodulated voltage, e.g., its center voltage depends on temperature. It is therefore likely that despite that the demodulator receives IF signals identical in content or data, the ADC outputs digital signals different in content.

SUMMARY OF THE INVENTION

It is therefore an object of the present invention to provide a radio pager in which an ADC is capable of outputting a stable digital signal identical in content or data with an IF signal input to a demodulator even when a demodulated voltage changes due to a change in temperature.

A radio pager of the present invention has a demodulator for executing frequency demodulation with an IF signal corresponding to a paging signal having been subjected to frequency modulation by a data signal including an address number, for thereby outputting a demodulated voltage signal in the form of an analog signal. At least one of the demodulation sensitivity and demodulated center voltage of thedemodulated voltage signal changes with a change in temperature. An ADC converts the demodulated voltage signal to a digital signal, and defines the upper limit and lower limit of the analog signal conversion range of the ADC with a first and a second reference voltage, respectively. An alerting device alerts the user of the radio pager to an incoming call when an address number produced by decoding the digital signal is identical with an address number assigned to the radio pager and stored beforehand. A correcting circuit maintains, even when the demodulated voltage signal changes due to a change in temperature, the relation between the signal range of the demodulated voltage signal and the analog signal conversion range substantially constant.

BRIEF DESCRIPTION OF THE DRAWINGS

FIGS. 2A and 2B are a block diagram schematically showing a first embodiment of the radio pager in accordance with the present invention;

FIGS. 9A and 9B are a block diagram schematically showing a second embodiment of the present invention;

DESCRIPTION OF THE PREFERRED EMBODIMENTS

Figure 1A:
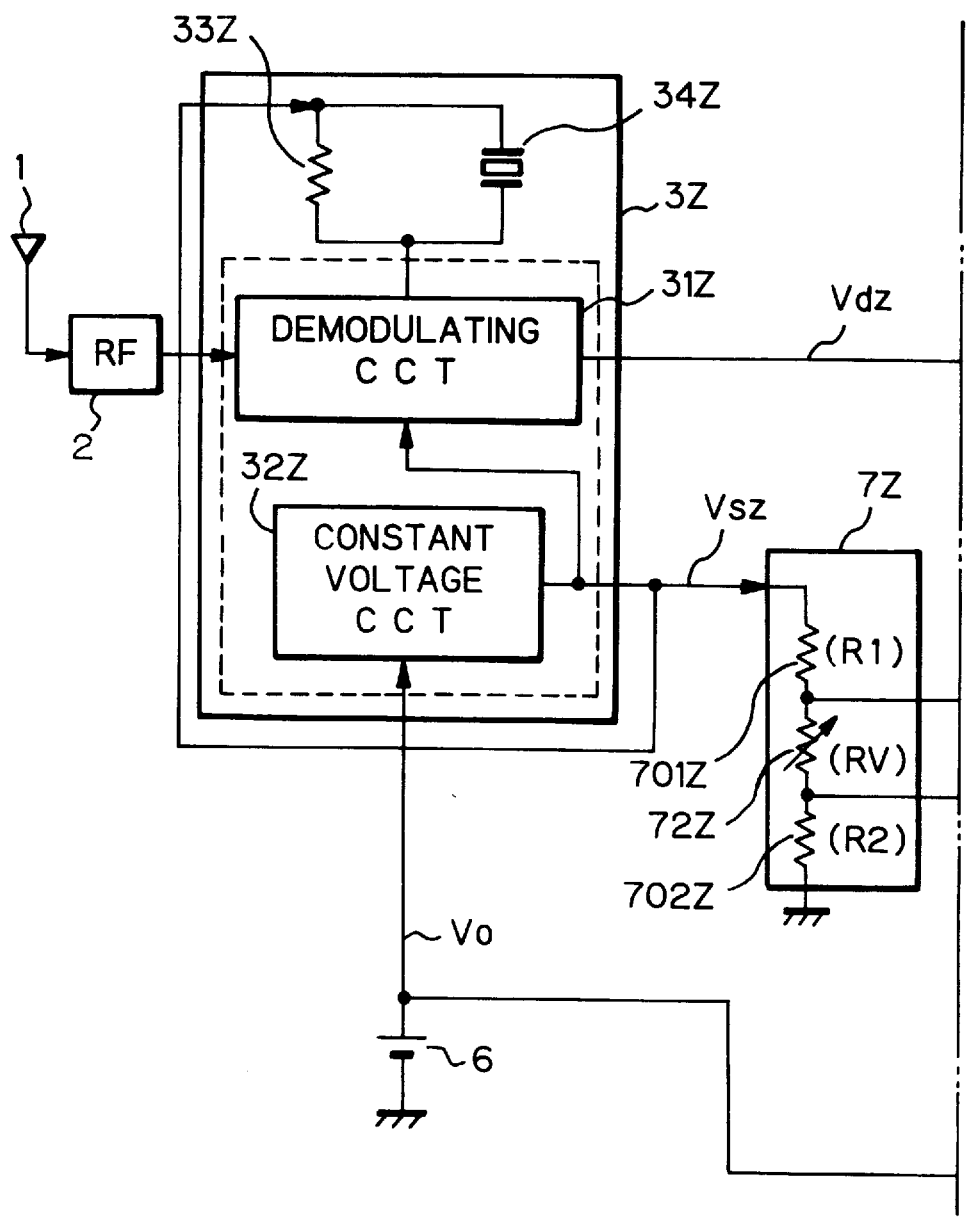
FIGS. 1A and 1B are a block diagram schematically showing a radio pager which is the related art of the present invention.
Figure 1B:
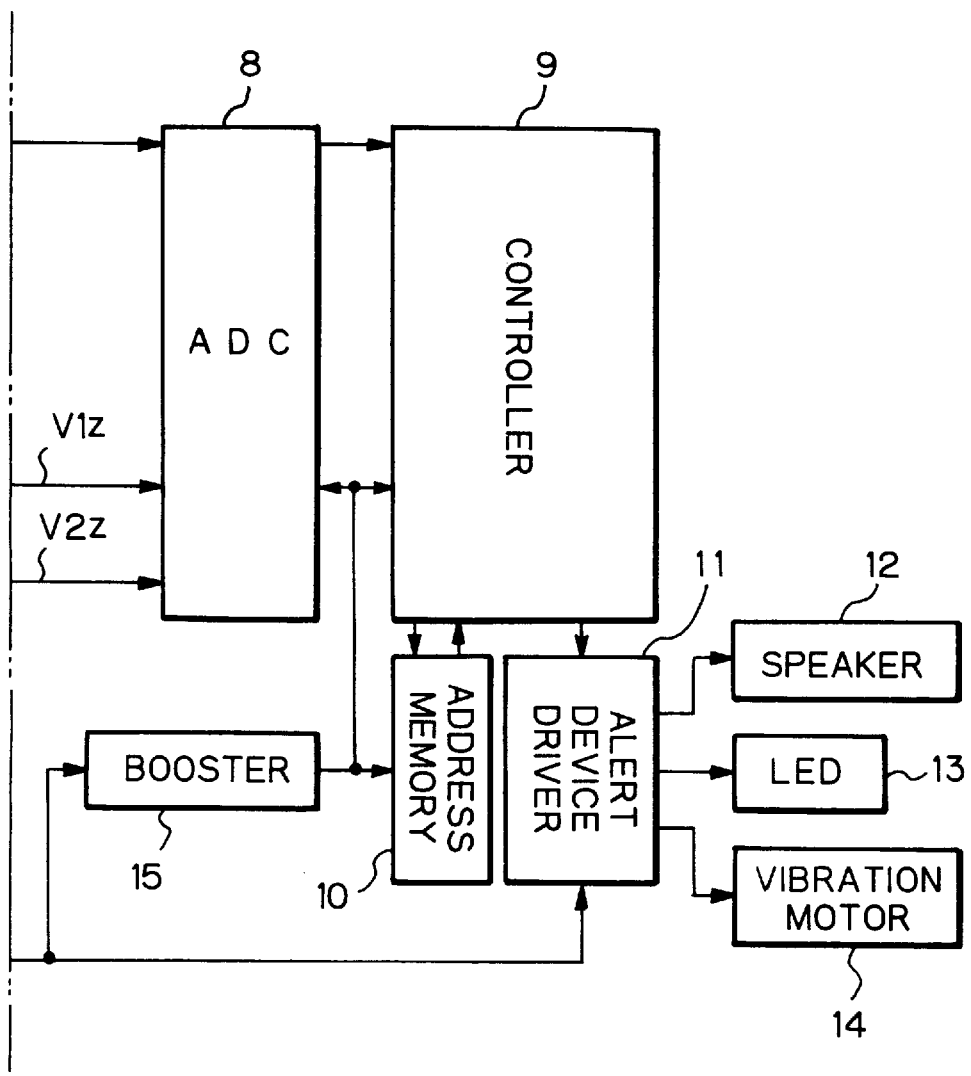

To better understand the present invention, a brief reference will be made to a radio pager which is the related art of the present invention. As shown in FIGS. 1A and 1B, the radio pager has an antenna 1 and an RF section 2. A paging signal having, e.g., an ERMES format is received by the antenna 1 and fed to the RF section 2. The paging signal is a signal generated by subjecting, e.g., a 169 MHz band carrier frequency to four-level frequency modulation with a deviation of 6,875 kHz. The paging signal includes an address number and a message. The RF section 2 amplifies the paging signal and converts its frequency to thereby output an IF signal lying in, e.g., a 455 kHz band. The IF signal is applied to a demodulator 3Z which is powered by a battery 6 outputting a voltage $V_0$.

The demodulator 3Z demodulates the IF signal by an frequency modulation (FM) scheme to thereby output a four-level demodulated voltage Vdz. The demodulator 3Z belonging to a family of frequency discriminators matches the resonance frequency of a ceramic resonator 34Z to a desired demodulation center frequency $f_0$. A demodulating circuit 31Z is an electronic circuit for demodulation while a constant voltage circuit 32Z feeds a substantially constant voltage Vsz to the circuit 31Z. Usually, the demodulating circuit 31Z and constant voltage circuit 32Z are implemented as a single IC (Integrated Circuit) chip for IF. A fixed resistor 33Z is connected in parallel to the resonator 34Z in order to adjust the input frequency to demodulated voltage characteristic (demodulation sensitivity) of the demodulated voltage Vdz. The voltage Vsz output from the constant voltage circuit 32Z is fed to the RF section 2 also.

The demodulated voltage, or analog signal, Vdz is applied to an ADC 8. The ADC 8 converts the voltage Vdz to an eight-bit digital signal having substantially four levels on the basis of reference voltages V1z and V2z fed thereto. Specifically, the reference voltages V1z and V2z respectively define the upper limit and lower limit for the modulation of the demodulated voltage Vdz. For the ADC 8, use may be made of CF45084PT (trade name) available from Texas Instruments (USA) by way of example. It follows that the reference voltages V1z and V2z should preferably match the maximum variation range of the demodulated voltage Vdz in order to promote the effective use of the analog signal conversion range of the ADC 8.

The reference voltages V1z and V2z are generated by a reference voltage generator 7Z which receives the voltage Vsz from the constant voltage circuit 32Z. The reference voltage generator 7Z is a voltage divider implemented as a series connection of a fixed resistor 701Z, a variable resistor 72Z, and a fixed resistor 702Z. The voltage Vsz output from the constant voltage circuit 32Z is applied to one end of the fixed resistor 701Z. One end of the fixed resistor 702Z is connected to ground. The reference voltages V1z and V2z respectively appear on the other end of the resistor 701Z and the other end of the resistor 702Z.

Assume that the fixed resistors 701Z and 702Z have resistances R1 and R2, respectively. Then, the voltage Vsz, reference voltages V1z and V2z and resistances R1 and R2 are related as follows:

$$Vsz = V1z + (R1/R2)V2z \qquad \text{Eq. (1)}$$

As the Eq. (1) indicates, the reference voltages V1z and V2z are determined by the ratio of the resistance R1 to the resistance R2. It is to be noted that the reference voltage generator 7Z adjusts the resistance RV of the variable resistor 72Z to set the reference voltage V2z and thereby sets the reference voltage V1z also.

The digital signal output from the ADC 8 is delivered to a controller 9 including a decoder. The decoder decodes the input digital signal and outputs the resulting address number, message and so forth. The controller 9 compares the decoded address number and an address number assigned to the pager and stored in an address memory 10 beforehand. If the two address numbers compare equal, the controller 9 causes an alert device driver 11 to drive a speaker 12, an LED (Light Emitting Diode) 13 or a vibration motor 14. The resulting alert tone output from the speaker 12, light issuing from the LED 13 or vibration of the motor 14 alerts the user of the pager to the incoming call.

A booster 15 boosts the output voltage $V_0$ of the battery 6 and feeds the boosted voltage to the controller 9, address memory 10, and ADC 8.

In the above construction, the modulation sensitivity of the demodulator 3Z, the center voltage $Vdz_0$ of the demodulated voltage Vdz and their temperature characteristic depend on the demodulating circuit 31Z, constant voltage circuit 32Z, and ceramic resonator 34Z. Therefore, it is optimal that the reference voltages V1z and V2z delimiting the signal conversion range of the ADC 8 be matched to the maximum variation range of the demodulated voltage Vdz, as stated earlier.

However, when the demodulation characteristic of the demodulator 3Z noticeably depends on temperature, it is necessary to broaden the signal conversion range of the ADC 8, as discussed previously. A broader ADC conversion range directly translates into a lower ADC resolution and therefore into a greater ADC error. As a result, the output digital signal is more susceptible to noise and other undesirable factors. Further, the relation between the signal conversion range of the ADC 8 and the demodulated voltage Vdz, e.g., its center voltage $Vdz_0$ depends on temperature. It is therefore likely that despite that the demodulator 3Z receives IF signals identical in content or data, the ADC 8 outputs digital signals different in content.

Preferred embodiments of the radio pager in accordance with the present invention and constituting improvements over the pager of FIGS. 1A and 1B will be described hereinafter.

1st Embodiment

Figure 2B:
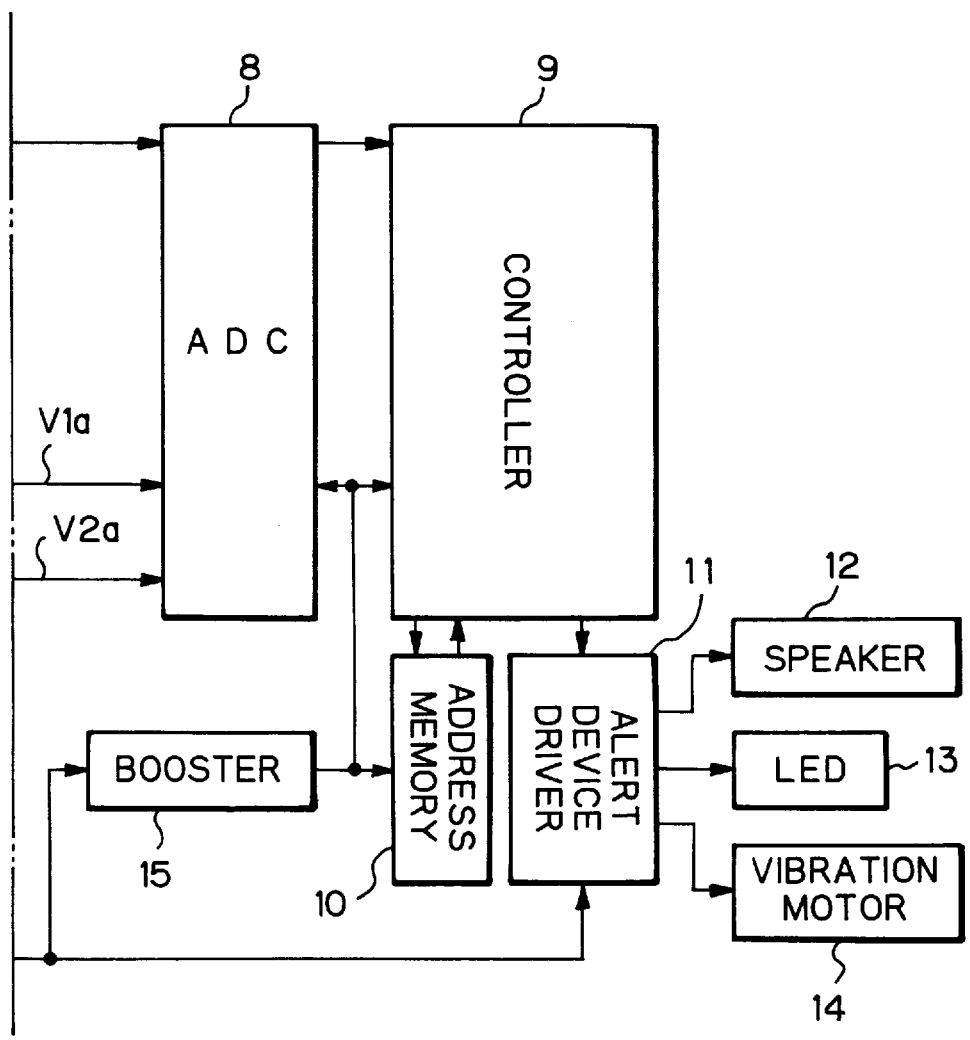
Figure 3A:
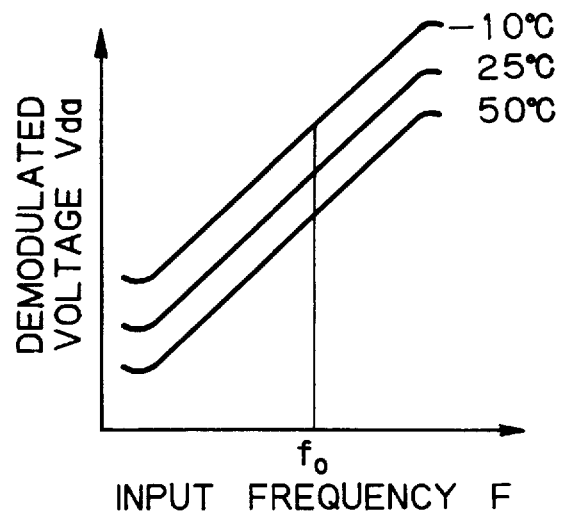
FIGS. 3A–3C show characteristics particular to the first embodiment.
Figure 3B:
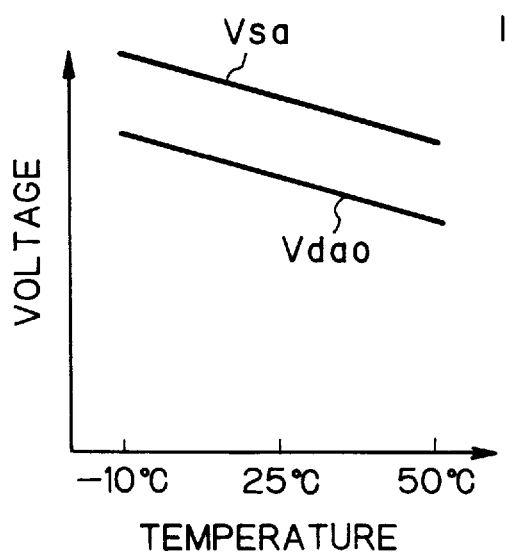
Figure 3C:
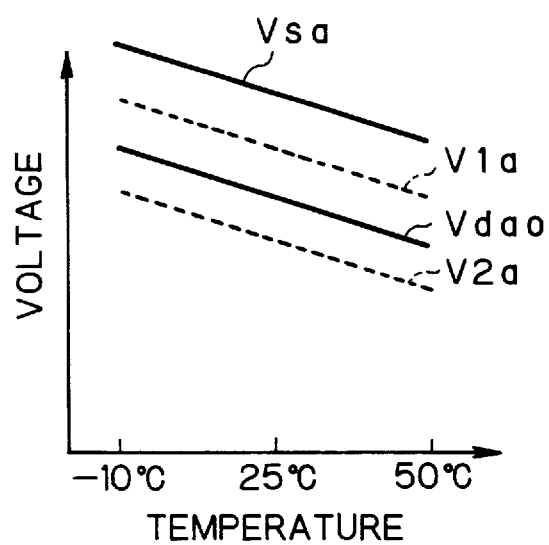

Referring to FIGS. 2A and 2B, a first embodiment of the radio pager in accordance with the present invention is shown. FIG. 3A shows the demodulation sensitivity characteristic of a demodulated voltage output from a demodulator which is included in the pager. FIG. 3B shows the temperature characteristic of a demodulated center voltage and that of a voltage for reference also output from the demodulator. FIG. 3C shows the temperature characteristics of reference voltages and demodulated center voltage input to the ADC also included in the pager, and the temperature characteristic of a voltage for reference output from a constant voltage circuit further included in the pager.

As shown in FIG. 2, the pager is similar to the pager of FIG. 1 except that a demodulator 3A and a reference voltage generator 7A1 are substituted for the demodulator 3Z and reference voltage generator 7Z, respectively. Therefore, the constructions and operations of the same constituent parts as the parts shown in FIG. 1 will not be described specifically in order to avoid redundancy. The demodulator 3A has a demodulating circuit 31A and a constant voltage circuit 32A implemented as a single IC chip. A ceramic resonator 34A has a characteristic matching the IC chip. A fixed resistor 33A is connected in parallel to the resonator 34A in order to adjust the demodulation sensitivity of the demodulator 3A. The demodulator 3A powered by a battery 6 outputting a voltage $V_0$ executes frequency modulation with an IF signal and thereby produces a four-level demodulated voltage Vda. The demodulator 3A is a specific form of a frequency discriminator for matching the resonance frequency of the resonator 34A to a desired demodulation center frequency $f_0$. The demodulating circuit 31A is an electronic circuit for demodulation. The constant voltage circuit 32A generates, based on the voltage fed from the battery 6, a voltage Vsa for reference which is substantially constant, but decreases with an increase in temperature.

As to the demodulation sensitivity, i.e., the input frequency F to demodulated voltage Vda characteristic, the demodulated voltage Vda output from the demodulator 3A and having an "S" curve characteristic does not change even when the temperature changes (see FIG. 3A). However, a demodulated center voltage $Vda_0$ demodulated at the center frequency $f_0$ of an input IF signal is substantially proportional to the voltage Vsa and therefore decreases with an increase in temperature in the same manner as the voltage Vsa (see FIG. 3B). Why the voltage Vsa is caused to decrease with an increase in temperature at a rate of, e.g., −2 mV/° C. is that the level of the IF signal output from the IF section 2 should remain substantially constant without regard to temperature. Specifically, because the RF section 2 has its characteristic deteriorated at low temperature, the voltage Vsa also applied to the RF section 2 is raised at low temperature. The demodulating circuit 31A and constant voltage circuit 32A having the above capability may be implemented by an IC μPC7357GR (trade name) available from NEC (Japan). The two circuits 31A and 32A will be described in detail later.

The reference voltage generator 7A1 receives the voltage Vsa for reference from the constant voltage circuit 32A and, in turn, delivers reference voltages V1a and V2a to an ADC 8. The reference voltages V1a and V2a respectively define the upper limit and lower limit of the signal conversion range of the demodulated voltage Vda. The reference voltage generator 7A1 causes the reference voltages V1a and V2a to change in accordance with the demodulated center voltage $Vda_0$ which changes with a change in temperature. Specifically, when the center voltage $Vda_0$ drops due to temperature elevation, the reference voltage generator 7A1 lowers the reference voltages V1a and V2a in accordance with the decrement of the center voltage $Vda_0$ (see FIG. 3C).

As shown in FIGS. 2A and 2B, the reference voltage generator 7A1 is a voltage divider having a series connection of composite resistors 71A and 73A. The composite resistor 71A is a parallel connection of a fixed resistor 701A and a thermistor 704A while the composite resistor 73A is a series connection of a variable resistor 72A, a fixed resistor 702A, and a thermistor 703A. The voltage Vsa for reference is applied to one end of the composite resistor 71A. One end of the composite resistor 73A is connected to ground. The reference voltages V1a and V2 respectively appear on the other end of the composite resistor 71A and the other end of the composite resistor 73A.

Assume that the composite resistors 71A and 73A have resistances Z1 and Z2, respectively. Then, the voltage Vsa, reference voltages V1a and V2a and resistances Z1 and Z2 are related as follows:

$$Vsa = V1a + (Z1/Z2)V2a \qquad \text{Eq. (2)}$$

As the Eq. (2) indicates, the reference voltages V1a and V2a are determined by the ratio of the resistance Z1 to the resistance Z2. It is to be noted that the reference voltage generator 7A1 adjusts the resistance of the variable resistor 72A to set the reference voltage V2a and thereby sets the reference voltage V1a also.

The voltage Vsa and demodulated center voltage $Vda_0$ each changes with a change in temperature at a substantially constant rate, as stated earlier. If the voltage Vsa and the reference voltages V1a and V2a change with a change in temperature with the same gradient as each other, then the potential difference between the reference voltages V1a and V2a will remain constant despite a change in temperature. Therefore, with the illustrative embodiment, it is possible to maintain the demodulated center voltage $Vda_0$ at substantially the intermediate between the reference voltages V1a and V2a at all times. The constant potential difference is achievable only if the combination of the fixed resistor 701A and thermistor 701A and the combination of the fixed resistor 702A and thermistor 703A are each provided with an adequate resistance. Of course, the resolution available with the ADC 8 will be best used if the difference between the reference voltages V1a and V2a is set at the maximum variation range of the demodulated voltage Vda.

Figure 4:
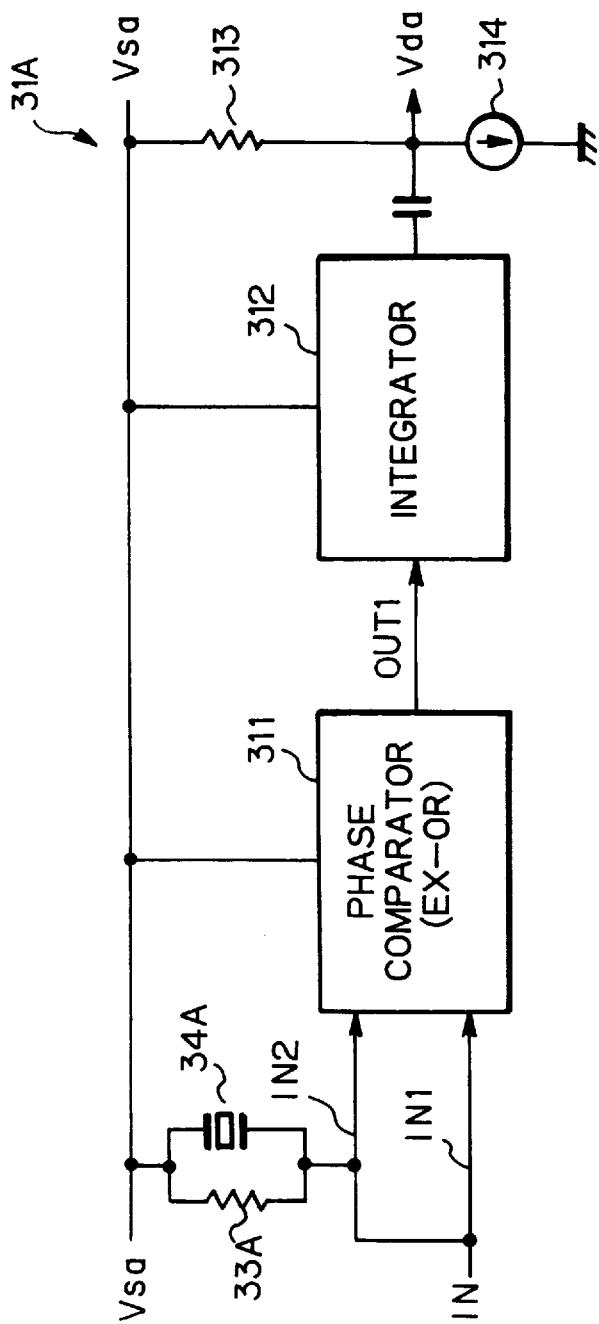
FIG. 4 is a schematic block diagram showing a demodulator included in the first embodiment.

The demodulating circuit 31A and constant voltage circuit 32A implemented as a single IC chip will be described in detail. As shown in FIG. 4, the demodulating circuit 31A mainly consists of a phase comparator or EX-OR (Exclusive OR) gate 311 and an integrator 312. A signal IN output from the RF section 2 is input to the phase comparator 311 as a first input signal IN1 and input to the ceramic resonator 34A as well. The output of the resonator 34A changed in phase by the signal IN1 is input to the phase comparator 311 as a second input signal IN2. The phase comparator 311 produces an EX-OR of the two input signals IN1 and IN2 and feeds its output OUT1 to the integrator 312.

Figure 5:
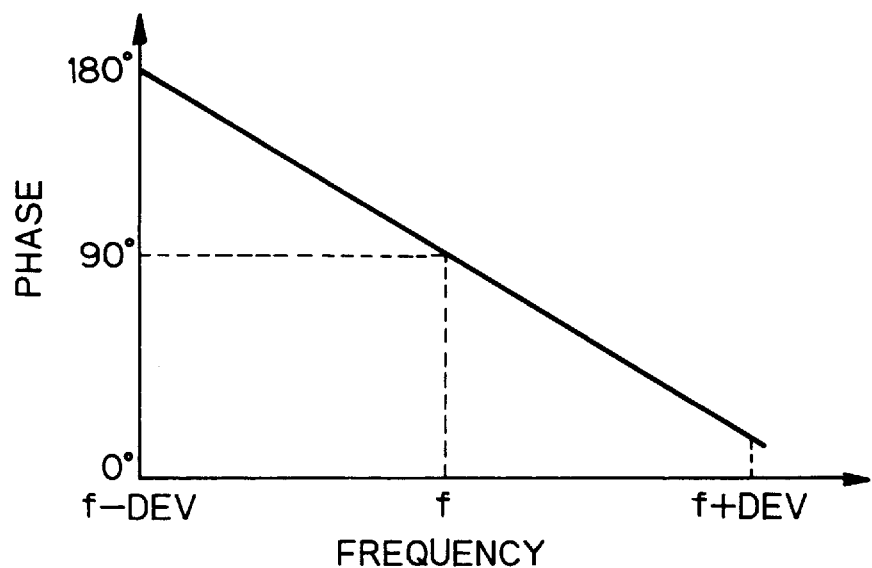
FIG. 5 shows a discrete phase characteristic.
Figure 6:
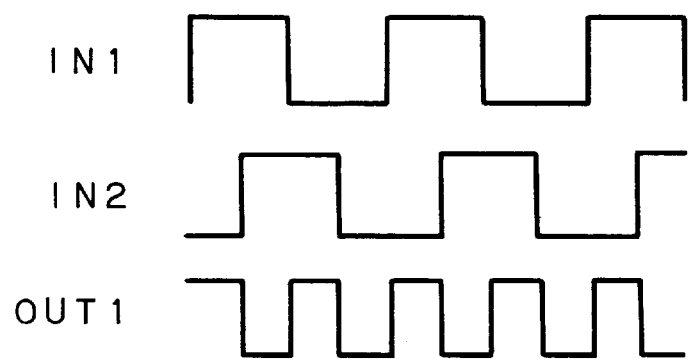
FIG. 6 shows the waveforms of signals input and output from the demodulator of FIG. 4.

Assume that the input signal IN has a frequency f and has a discrete phase characteristic shown in FIG. 5. Then, as shown in FIG. 5, the phase deviation is about 90 degrees for the frequency f. Therefore, the first and second input signals IN1 and IN2 have respective waveforms shown in FIG. 6. The resulting EX-OR of the signals IN1 and IN2, i.e., the output OUT1 of the phase comparator 311 has a waveform also shown in FIG. 6. The signal OUT1 is fed to the integrator 312 to turn out the previously stated demodulated voltage Vda.

In practice, the frequency f of the signal IN has been modulated. If the signal IN has the ERMES format, then signals having four different levels, i.e., ±4.6875 and ±1.5625 will be input. As a result, signals of different voltages will be output due to the discrete phase characteristic and will be subjected to frequency-to-voltage conversion (demodulation). When the single IC chip is implemented by the previously mentioned μPC7357GR, the demodulated center voltage $Vda_0$ thereof depends on the output voltage Vsa of the constant voltage circuit 32A. This is because, as shown in FIG. 4, the output terminal of the demodulating circuit 31A has the output voltage Vsa and is biased by a resistor 313 and a constant current source 314.

Figure 7:
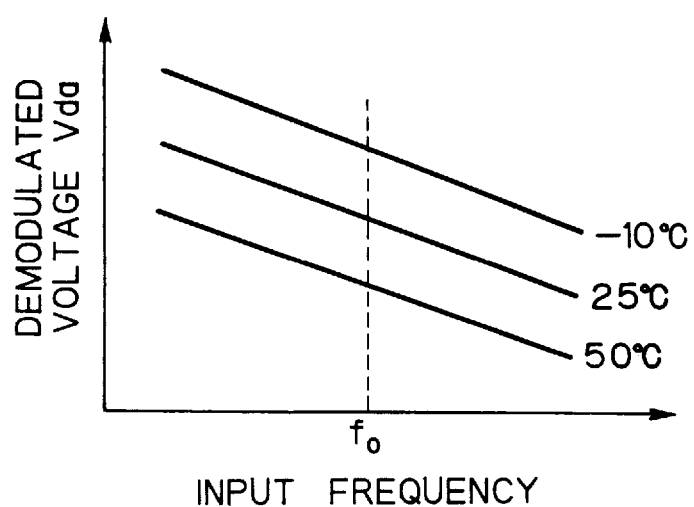
FIG. 7 shows a frequency characteristic of a demodulated voltage.

On the other hand, the discrete phase characteristic is sparingly dependent on temperature. Therefore, as shown in FIG. 7, the frequency characteristic of the demodulated voltage Vda is such that only the center voltage $Vda_0$ changes. It follows that when use is made of μPC7357GR, there can be output a demodulated voltage Vda which does not change in amplitude, but changes only in potential.

Figure 8:
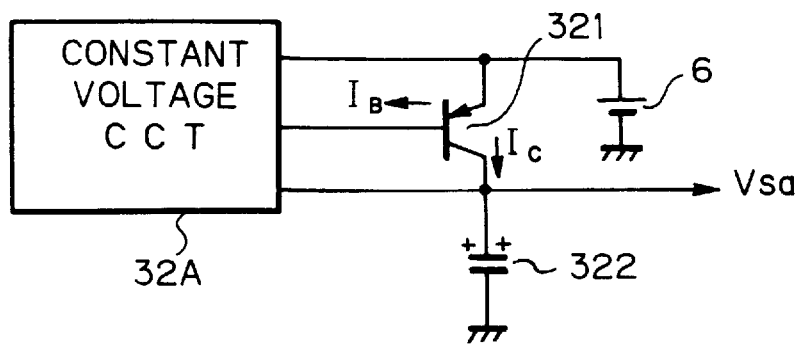
FIG. 8 is a schematic block diagram showing a constant voltage circuit.

As shown in FIG. 8, the constant voltage circuit 32A controls the base current of a PNP transistor 321. Specifically, the circuit 32A monitors the collector voltage of the transistor 321 and controls the base current on the basis of whether the collector voltage is higher than or lower than a reference voltage. As a result, the charge of a tantulum capacitor 322 is controlled.

As stated above and as shown in FIG. 3C, this embodiment equalizes the gradient of the demodulated center voltage Vda0 and that of the reference voltages V1a and V2a which are ascribable to temperature. This, coupled with the fact that the demodulation sensitivity remains constant without regard to temperature, maintains the relation between the demodulated voltage Vda and the analog signal conversion range of the ADC 8. Therefore, although the demodulated voltage Vda may change due to temperature, the ADC 8 can constantly output a stable digital signal identical in content or data with the IF signal input to the demodulator 3A.

2nd Embodiment

Figure 9B:
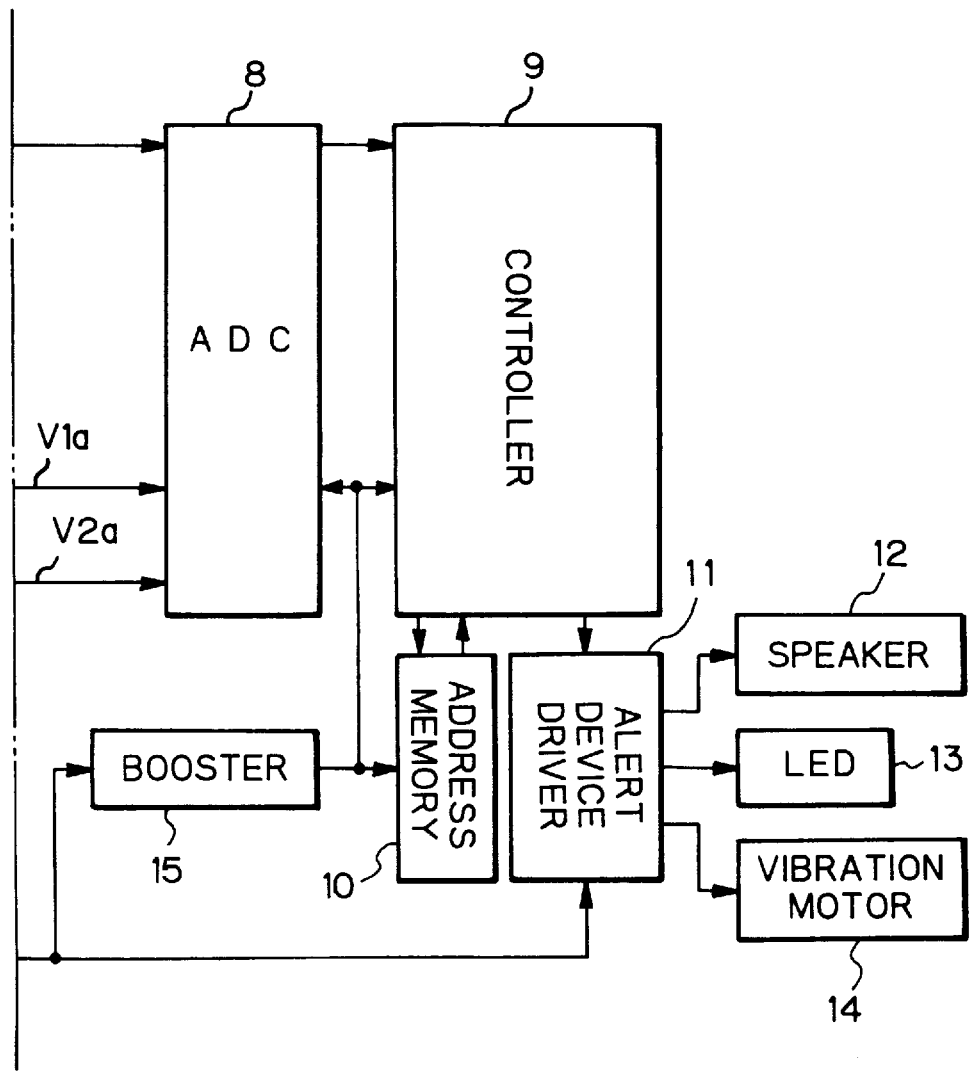

Referring to FIGS. 9A and 9B, a second embodiment of the present invention will be described. As shown, this embodiment is similar to the first embodiment except that a reference voltage generator 7A2 is substituted for the reference voltage generator 7A1. Therefore, the functions and operations of the same constituent parts as the parts of FIG. 2 will not be described in order to avoid redundancy.

In the illustrative embodiment, the reference voltage generator 7A2 has constant voltage output ICs 74 and 75. The IC 74 receives the output voltage $V_0$ of the battery 6 and, in turn, outputs the reference voltage V1a shown in FIG. 3C. The IC 75 outputs the reference voltage V2a on the basis of the voltage $V_0$. The center voltage $Vda_0$ of the demodulated voltage Vda decreases with an increase in temperature, as stated earlier with reference to FIGS. 3A and 3B. In light of this, this embodiment also equalizes the gradients of the reference voltages V1a and V2a output from the ICs 74 and 75, respectively, and the gradient of the output voltage Vsa of the constant voltage circuit 32A; the gradients are ascribable to temperature variation. Consequently, the relation between the reference voltages V1a and V2a defining the conversion range of the analog signal input to the ADC 8 and the variation of the demodulated center voltage $Vda_0$ due to temperature is maintained substantially constant.

The above embodiment, like the first embodiment, outputs the demodulated voltage Vda and reference voltages V1a and V2a and therefore achieves the previously stated advantages.

3rd Embodiment

Figure 10A:
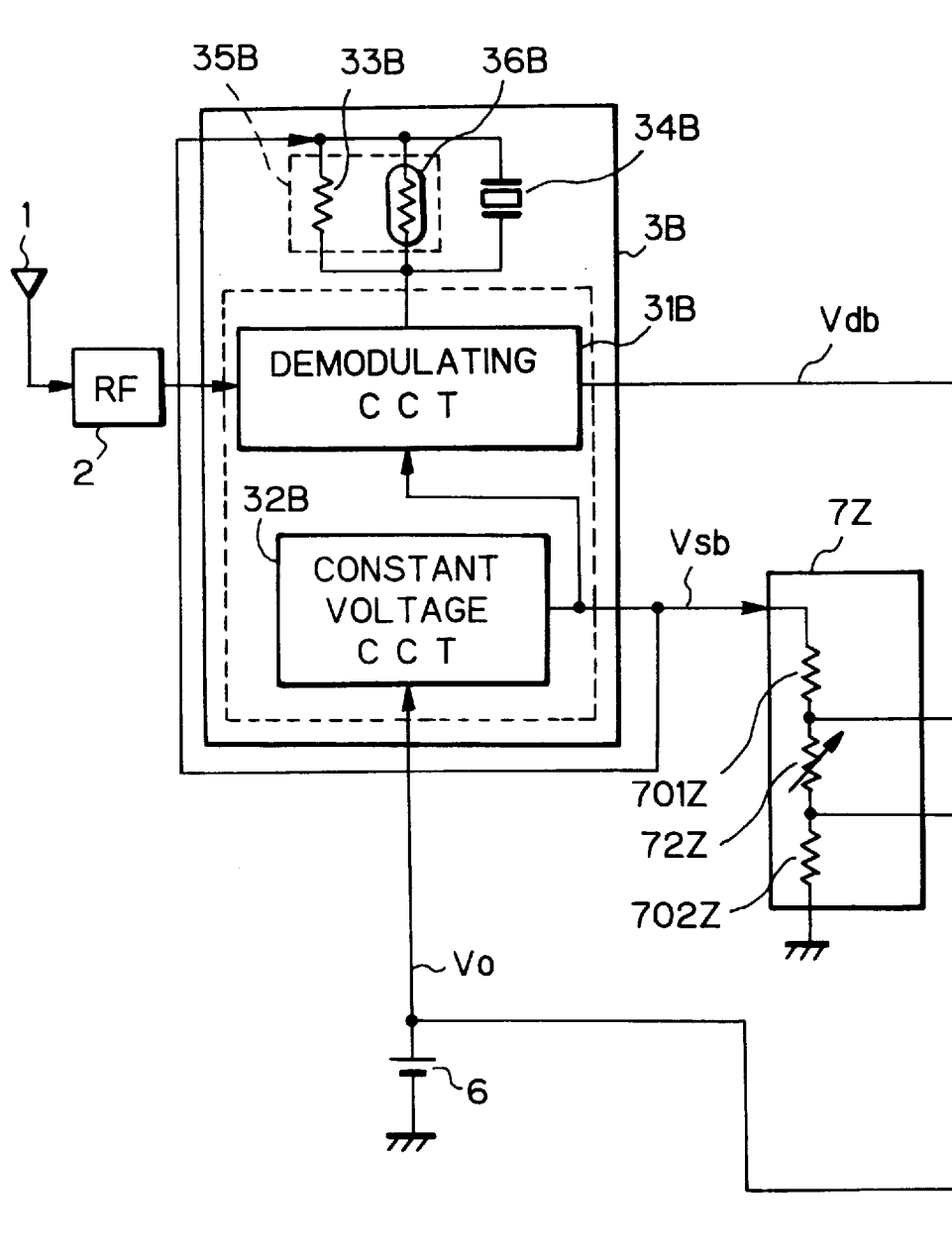
FIGS. 10A and 10B are a block diagram schematically showing a third embodiment of the present invention.
Figure 10B:
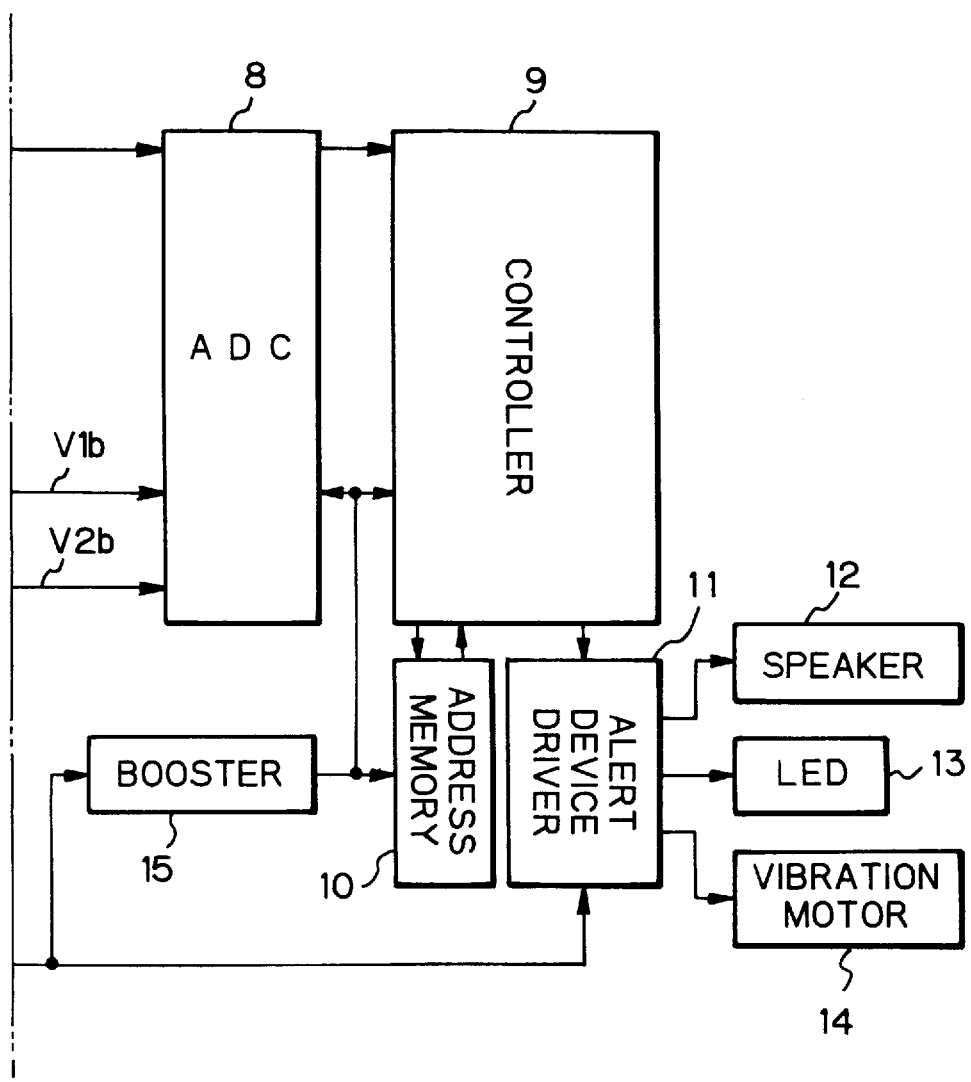
Figure 11A:
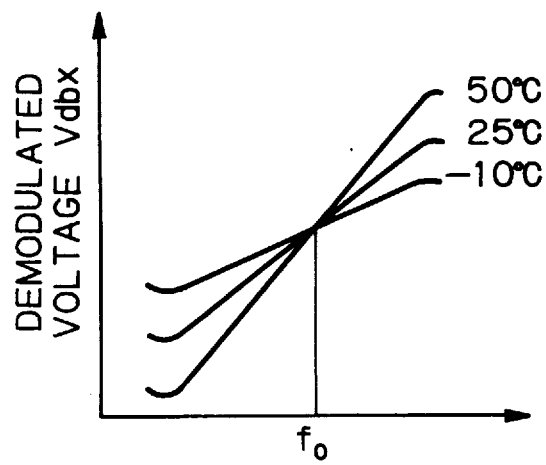
FIGS. 11A–11C show characteristics particular to the third embodiment.
Figure 11B:
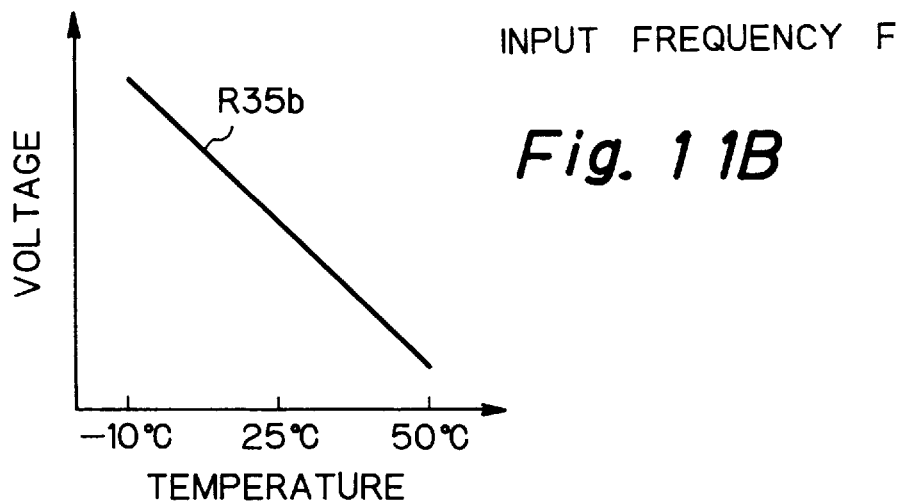
Figure 11C:
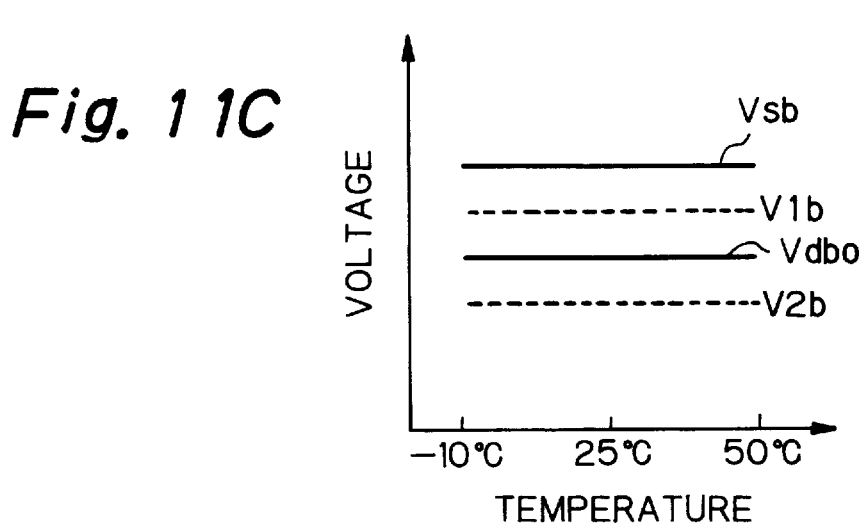

FIGS. 10A and 10B shows a third embodiment of the present invention. FIG. 11A shows the demodulation sensitivity characteristic of the voltage demodulated by a demodulator included in the embodiment, but not corrected with respect to temperature. FIG. 11B shows the temperature characteristic of a composite resistor included in the demodulator. FIG. 11C shows the temperature characteristic of reference voltages input to an ADC included in the embodiment, and a voltage for reference input to a reference voltage generator. This embodiment is similar to the related art of FIGS. 1A and 1B except that a demodulator 3B is substituted for the demodulator 3Z. Therefore, the functions and operations of the same constituent parts as the parts shown in FIG. 1 will not be described in order to avoid redundancy.

The demodulator 3B has a demodulating circuit 31B and a constant voltage circuit 32B implemented as a single IC chip. A ceramic resonator 34B has a characteristic matching the IC chip. A composite resistor 35B for demodulation sensitivity adjustment is connected in parallel to the resonator 34B. The composite resistor 35B is a parallel connection of a fixed resistor 33B and a thermistor 36B. The demodulator 3B powered by the battery 6 outputting the voltage $V_0$ executes frequency modulation with the IF signal to thereby output the four-level demodulated voltage Vdb. The demodulator 3B is a specific form of a frequency discriminator for matching the resonance frequency of the resonator 34B to a desired demodulation center frequency $f_0$. The demodulating circuit 31B is an electronic circuit for demodulation. The constant voltage circuit 32B receiving the output voltage of the battery 6 feeds to the demodulating circuit 31 the voltage Vsb for reference which is substantially constant and, in addition, not dependent on temperature (see FIG. 11C).

The demodulated center voltage $Vdb_0$ output from the demodulator 3B does not change without regard to temperature. When the thermistor 36B whose resistance decreases with an increase in temperature is omitted so as not to effect temperature compensation, the demodulator 3B outputs a demodulated voltage Vdbx whose demodulation sensitivity increases with an increase in temperature (see FIG. 11A). The demodulating circuit 31B and constant voltage circuit 32B implemented as a single IC chip and having the above capability may be constituted by an IC CXA1474N available from SONY (Japan). In the demodulator 3B, the composite resistor, or damping resistor for demodulation sensitivity, 35B has its resistance R35b sequentially reduced with an increase in temperature due to the effect of the thermistor 36B (see FIG. 11B). As a result, the demodulation sensitivity is lowered at the high temperature side so as to be free from temperature dependency. It follows that the demodulation sensitivity characteristic and demodulated voltage Vdb of the demodulator 3B after temperature compensation are represented by a curve of 25° C. shown in FIG. 11A.

The demodulated voltage Vdb and voltage Vsb for reference output from the demodulator 3B are free from temperature dependency. Therefore, the reference voltages Vb1 and Vb2 respectively defining the upper limit and lower limit of the signal conversion range of the ADC 8 must not be dependent on temperature. For this reason, the reference voltage generating circuit may be constituted by the circuit 7Z shown in FIG. 1. However, the circuit 7Z must be adjusted such that the voltage Vsb for reference fed from the constant voltage circuit 32B is substantially constant and not dependent on temperature, and the resistances of the fixed resistors 701Z and 702Z and variable resistor 72Z match the voltage Vsb and required reference voltages V1b and V2b. Consequently, the reference voltages V1b and V2b are free from temperature dependency (see FIG. 11C). The relation between the voltage Vsb and the reference voltages V1b and V2b is represented by the following equation as well as by the previous Eq. (1):

$$Vsb = V1b + (R1/R2)V2b \qquad \text{Eq. (3)}$$

As stated above and as shown in FIG. 11C, the demodulated center voltage $Vda_0$ and the reference voltages V1a and V2a input to the ADC 8 remain constant without regard to temperature. In addition, the demodulation sensitivity remains constant without regard to temperature. Therefore, the relation between the demodulated voltage Vdb and the signal conversion range of the ADC 8 is held constant. In this condition, even if the demodulated voltage Vdbx not subjected to temperature compensation changes due to a change in temperature, the ADC 8 is capable of outputting a stable digital signal identical in data with the IF signal input to the demodulator 3B.

4th Embodiment

Figure 12A:
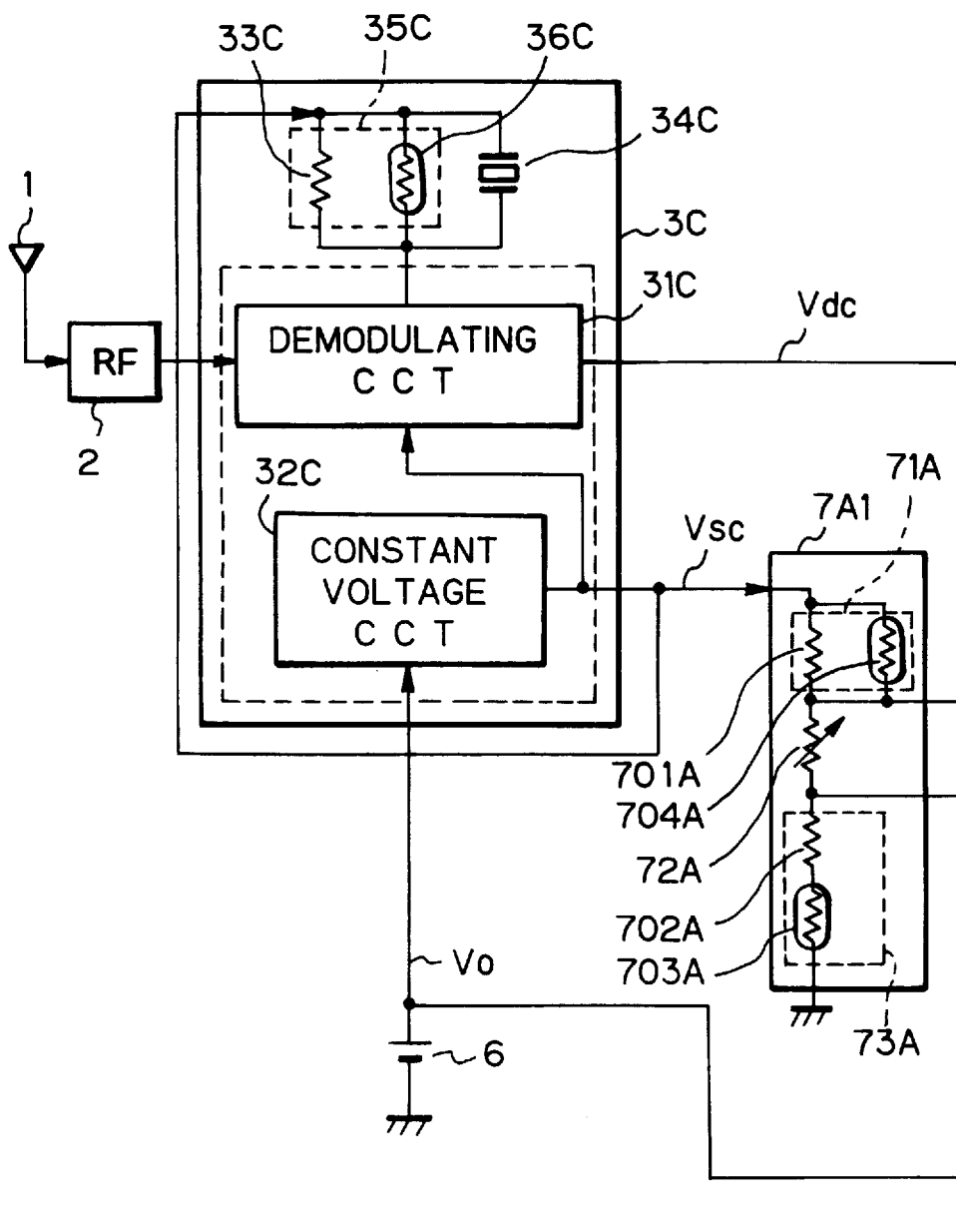
FIGS. 12A and 12B are a block diagram schematically showing a fourth embodiment of the present invention.
Figure 12B:
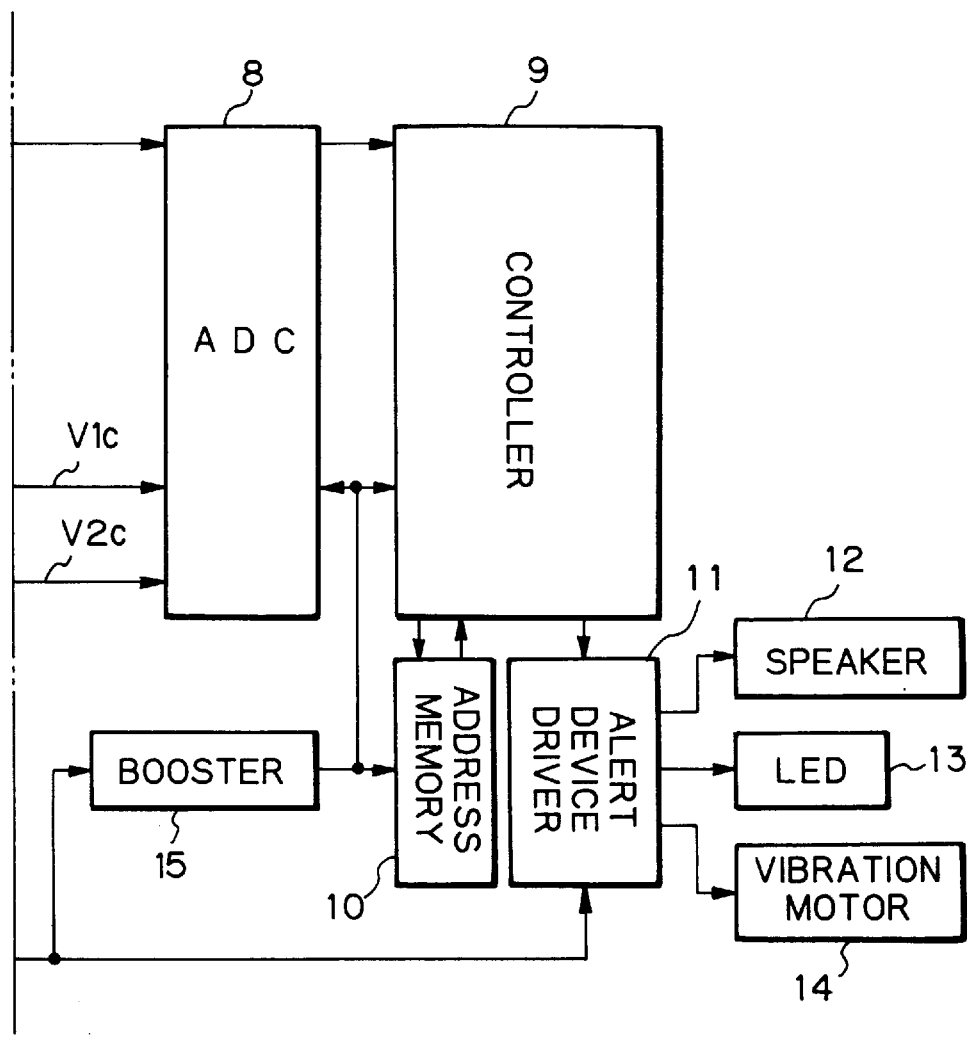
Figure 13A:
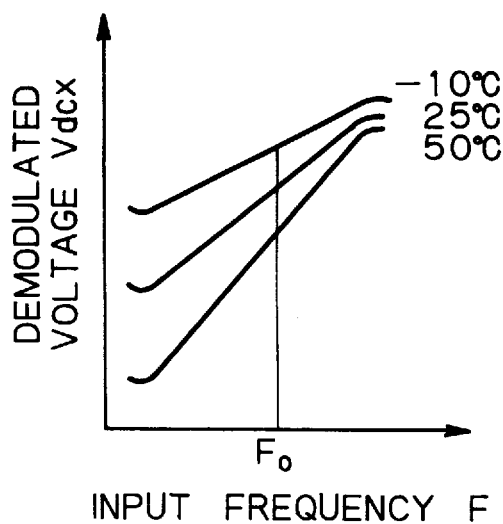
FIGS. 13A–13D show characteristics particular to the fourth embodiment.
Figure 13B:
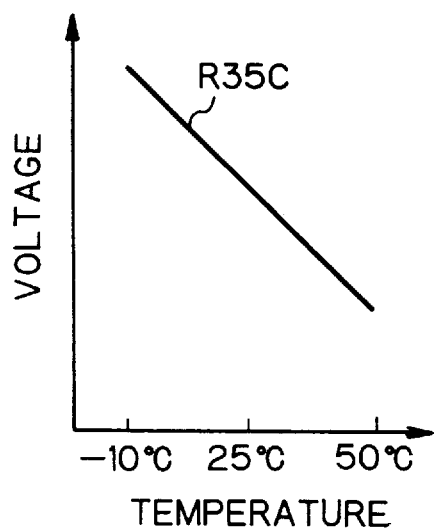
Figure 13C:
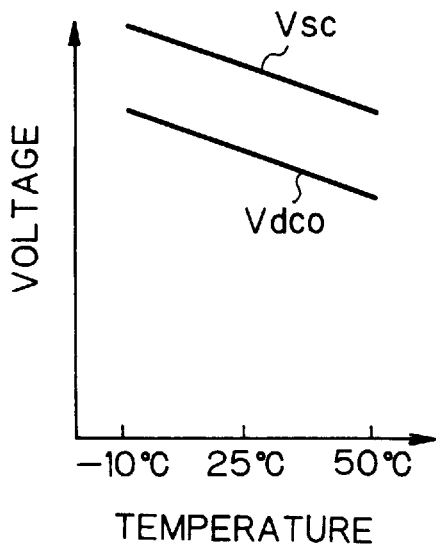
Figure 13D:
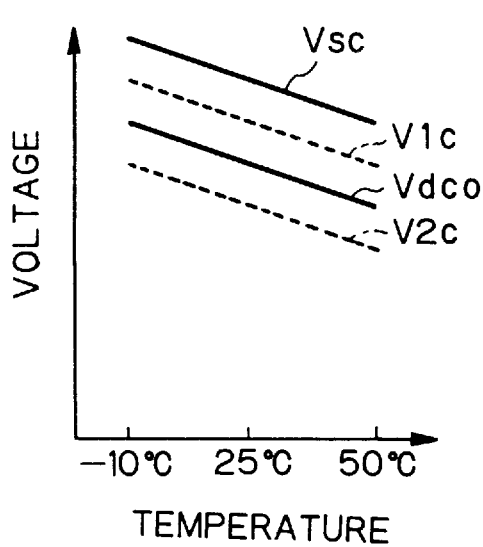

FIGS. 12A and 12B show a fourth embodiment of the present invention. FIG. 13A shows the demodulation sensitivity characteristic of a demodulated voltage output from a demodulator included in the embodiment, but not subjected to temperature compensation. FIG. 13B shows the temperature characteristic of a composite resistor included in the demodulator. FIG. 13C shows the temperature characteristic of a demodulated center voltage and that of a voltage for reference applied to a reference voltage generator. FIG. 13D shows the temperature characteristic of reference voltages input to an ADC included in the embodiment and that of a demodulated center voltage and voltage for reference. This embodiment is similar to the embodiment of FIGS. 2A and 2B except that a demodulator 3C is substituted for the demodulator 3A. Therefore, the same constituent parts as the parts shown in FIG. 2 will not be described specifically in order to avoid redundancy.

The demodulator 3C has a demodulating circuit 31C and a constant voltage circuit 32C implemented as a single IC chip. A ceramic resonator 34C has a characteristic matching the IC chip. A composite resistor 34C for demodulation sensitivity adjustment is connected in parallel to the resonator 34C. The composite resistor 35 is a parallel connection of a fixed resistor 33C and a thermistor 36C. The demodulator 3C powered by the battery 6 outputting the voltage V0 executes frequency modulation with the IF signal to thereby output a four-level demodulated voltage Vdc. The demodulator 3C is a specific form of a frequency discriminator for matching the resonance frequency of the resonator 34C to a desired demodulated center frequency $f_0$. The demodulating circuit 31C is an electronic circuit for demodulation. The constant voltage circuit 32C receiving the voltage $V_0$ delivers to the demodulating circuit 31C a voltage Vsc for reference which remains substantially constant, but sequentially drops as the temperature rises (see FIG. 7C).

When the thermistor 36B whose resistance decreases with an increase in temperature is omitted so as not to effect temperature compensation, the demodulator 3C outputs a demodulated voltage Vdcx having demodulation sensitivity and demodulated center voltage $Vdb_0$ which respectively increase and decrease with an increase in temperature (see FIG. 13A). The modulating circuit 31C and constant voltage circuit 32C implemented as a single IC chip and having the above capability may be constituted by an IC TA31144FN available from Toshiba (Japan). In the demodulator 3C, the composite resistor, or damping resistor for demodulation sensitivity, 35C has its resistance R35c sequentially reduced with an increase in temperature due to the effect of the thermistor 36C (see FIG. 13B). As a result, the demodulation sensitivity is lowered at the high temperature side so as to be free from temperature dependency. It follows that when the temperature changes, the demodulation sensitivity characteristic of the demodulator 3C after temperature compensation does not change, but the demodulated center voltage $Vdc_0$ drops substantially in proportion to the voltage Vsc as the temperature rises, as stated with reference to FIG. 3A.

The temperature-compensated demodulated voltage Vdc output from the demodulator 3C is substantially identical in characteristic as the demodulated voltage Vda of the first embodiment, as stated previously. In addition, the voltage Vsc output from the constant voltage circuit 32 is substantially identical in characteristic with the voltage Vsa of the first embodiment. Therefore, the reference voltage generator 7A1 of the first embodiment is also usable in order to generate the reference voltages V1a and V2a. Of course, it is necessary to adjust the resistances of the composite resistors 71A and 73A such that they match the demodulated voltage Vdc, voltage Vsc, and reference voltages V1c and V2c. Therefore, in the illustrative embodiment, the reference voltage generator 7A1 receives the voltage Vsc decreasing with an increase in temperature and, in turn, outputs the reference voltages V1c and V2c variable substantially in accordance with the demodulated center voltage $Vdc_0$ which is substantially proportional to the voltage Vsc (see FIG. 13D). Consequently, the reference voltage generator 7A1 can set the center voltage $Vdc_0$ substantially at the intermediate between the reference voltages V1c and V2c at all times.

The relation between the voltage Vsc and the reference voltages V1c and V2c is represented by the following equation as well as the Eq. (2):

$$Vsc = V1c + (Z1/Z2)V2c \qquad \text{Eq. (4)}$$

As stated above and as shown in FIG. 13D, the demodulated center voltage $Vda_0$ and the reference voltages V1c and V2c input to the ADC 8 have the same gradient ascribable to temperature. In addition, the demodulation sensitivity remains constant without regard to temperature. Therefore, the relation between the demodulated voltage Vdc and the signal conversion range of the ADC 8 is held constant. In this condition, even if the demodulated voltage Vdcx not subjected to temperature compensation changes due to a change in temperature, the ADC 8 is capable of outputting a stable digital signal identical in data with the IF signal input to the demodulator 3C.

In summary, in accordance with the present invention, an ADC receives a demodulated voltage signal in the form of an analog signal from a demodulator. The ADC functions to define the upper limit of an analog signal conversion range with a first reference voltage and to define the lower limit of the same with a second reference voltage. Even when at least one of the demodulation sensitivity and demodulated center voltage of the demodulated voltage signal changes with a change in temperature and causes the signal to change, the relation between the signal range of the demodulated voltage signal and the analog signal conversion range of the ADC is maintained constant. Therefore, even if the demodulated voltage signal before temperature compensation changes, the ADC is capable of outputting a stable digital signal identical in content or data with an IF signal input to the demodulator.

Various modifications will become possible for those skilled in the art after receiving the teachings of the present disclosure without departing from the scope thereof.

What is claimed is:

1. A radio pager comprising:
   a demodulator for executing frequency demodulation with an intermediate frequency (IF) signal corresponding to a paging signal having been subjected to frequency modulation by a data signal including an address number, for thereby outputting a demodulated voltage signal in a form of an analog signal, wherein at least one of a demodulation sensitivity and a demodulated center voltage of said demodulated voltage signal changes with a change in temperature;
   an analog-to-digital converter (ADC) for converting said demodulated voltage signal to a digital signal, and for defining an upper limit and a lower limit of an analog signal cover range of said analog-to-digital converter with a first and a second reference voltage, respectively;
   alerting means for alerting a user of said radio pager to an incoming call when the address number contained in the data signal is identical with an address number assigned to said radio pager and stored in said radio pager beforehand;
   correcting means for maintaining, even when said demodulated voltage signal changes due to a change in temperature, a relation between a signal range of said demodulated voltage signal, and said analog signal conversion range substantially constant, wherein when the temperature changes, said demodulated center voltage changes in accordance with an amount of change of the temperature, and wherein said correcting means comprises a reference voltage generator for causing said first and second reference voltages to change in accordance with an amount of change of said demodulated center voltage ascribable to the change in temperature, and wherein when the temperature rises, said demodulated center voltage drops in accordance with an amount of rise of the temperature, wherein the correcting means comprises a first composite resistor comprising a parallel connection of a first fixed resistor and a first thermistor, said first composite resistor being connected in series through a variable resistor with a second composite resistor, said second composite resistor comprising a series connection of a second fixed resistor and a second thermistor, wherein a demodulator reference voltage which decreases with an increase in temperature is output from said demodulator to one end of said first composite resistor, wherein said first reference voltage appears on the other end of said first composite resistor, and wherein said second reference voltage appears on one end of said second composite resistor.

* * * * *